United States Patent
Herthan et al.

(10) Patent No.: US 9,446,739 B2
(45) Date of Patent: Sep. 20, 2016

(54) CONTROL METHOD AND CONTROL SYSTEM FOR A VEHICLE CLOSING ELEMENT

(71) Applicant: BROSE FAHRZEUGTEILE GMBH & CO. KOMMANDITGESELLSCHAFT, HALLSTADT, Hallstadt (DE)

(72) Inventors: Bernd Herthan, Michelau (DE); Thomas Weingartner, Memmelsdorf (DE); Holger Wurstlein, Zeil am Main (DE); Udo Geuther, Bamberg (DE)

(73) Assignee: BROSE FAHRZEUGTEILE GMBH & CO. KOMMANDITGESELLSCHAFT, Hallstadt (DE)

( * ) Notice: Subject to any disclaimer, the term of this patent is extended or adjusted under 35 U.S.C. 154(b) by 0 days.

(21) Appl. No.: 14/420,222

(22) PCT Filed: Aug. 1, 2013

(86) PCT No.: PCT/EP2013/002290
§ 371 (c)(1),
(2) Date: May 14, 2015

(87) PCT Pub. No.: WO2014/023405
PCT Pub. Date: Feb. 13, 2014

(65) Prior Publication Data
US 2015/0262436 A1    Sep. 17, 2015

(30) Foreign Application Priority Data

Aug. 8, 2012 (DE) ........................ 10 2012 107 288

(51) Int. Cl.
*B60R 25/30* (2013.01)
*B60R 25/20* (2013.01)
(Continued)

(52) U.S. Cl.
CPC ........... *B60R 25/2054* (2013.01); *B60R 25/24*
(Continued)

(58) Field of Classification Search
CPC ... B60R 25/2054; B60R 25/01; B60R 25/00; B60R 13/07; B60R 25/246; B60R 25/24; G07C 9/00944; G07C 9/00126; E05Y 2900/546; E05Y 2400/86; E05Y 2400/852; E05Y 2400/858; E05F 15/2023; E05F 15/00; E05F 15/73; E05F 15/763; E05F 15/2046; E05F 15/2076; E05F 15/77; E05F 15/76; H03K 17/955; H03K 2217/960785; G06K 9/00355
USPC ....... 340/5.72, 5.51, 426.25, 426.28; 701/49, 701/36
See application file for complete search history.

(56) References Cited

U.S. PATENT DOCUMENTS 8,091,280 B2 * 1/2012 Hanzel ................ B60R 25/2054
296/146.4
(Continued)

FOREIGN PATENT DOCUMENTS

CN         103786684 A      5/2014
DE   10 2004 041 709 B3   10/2005
(Continued)

OTHER PUBLICATIONS

International Search Report, corresponding to PCT/EP2013/002290, dated Oct. 15, 2013, 8 pages.
(Continued)

*Primary Examiner* — Ali Neyzari
(74) *Attorney, Agent, or Firm* — Lewis Roca Rothgerber Christie LLP

(57) ABSTRACT

A method for controlling an adjusting movement of a power-operated adjustable vehicle closing element, via which a body opening of a vehicle can be closed and which can automatically be adjusted for clearing the body opening in the presence of an operating event is provided.

17 Claims, 6 Drawing Sheets

(51) Int. Cl.
    *G06K 9/00*         (2006.01)
    *B60R 25/24*      (2013.01)
    *H03K 17/955*     (2006.01)
    *G07C 9/00*         (2006.01)

(52) U.S. Cl.
    CPC ............ (2013.01); *G06K 9/00355* (2013.01); *G07C9/00126* (2013.01); *H03K 17/955* (2013.01); *E05Y 2400/852* (2013.01); *E05Y 2400/858* (2013.01); *H03K 2217/960785* (2013.01)

(56) References Cited

U.S. PATENT DOCUMENTS

| | | | |
|---|---|---|---|
| 8,228,166 B2 * | 7/2012 | Eberhard | ............ B60R 25/2036 340/5.61 |
| 8,843,277 B2 * | 9/2014 | Fuchs | .................... B60R 25/00 340/5.51 |
| 8,868,299 B2 | 10/2014 | Kroemke et al. | |
| 8,874,324 B2 * | 10/2014 | Eggers | ................... B60R 13/07 296/146.4 |
| 2007/0205863 A1 | 9/2007 | Eberhard | |
| 2008/0068145 A1 | 3/2008 | Weghaus et al. | |
| 2008/0296926 A1 | 12/2008 | Hanzel et al. | |
| 2012/0123649 A1 | 5/2012 | Eggers et al. | |
| 2012/0319502 A1 | 12/2012 | Van Gastel | |
| 2013/0018551 A1 | 1/2013 | Fuchs et al. | |
| 2013/0200995 A1 | 8/2013 | Muramatsu et al. | |
| 2013/0234828 A1 | 9/2013 | Holzber et al. | |

FOREIGN PATENT DOCUMENTS

| | | |
|---|---|---|
| DE | 10 2005 032 402 B3 | 9/2006 |
| DE | 10 2006 044 112 A1 | 3/2008 |
| DE | 10 2009 034 549 A1 | 1/2011 |
| DE | 10 2010 009 058 A1 | 8/2011 |
| DE | 10 2010 018 164 A1 | 8/2011 |
| DE | 10 2010 049 400 A1 | 4/2012 |
| EP | 0 999 102 A2 | 5/2000 |
| JP | 2003-138817 A | 5/2003 |
| JP | 2005-133529 A | 5/2005 |
| WO | WO 2007/006514 A1 | 1/2007 |
| WO | WO 2013/018333 A1 | 7/2013 |

OTHER PUBLICATIONS

English translation of Written Opinion of the International Searching Authority for International Application No. PCT/EP2013/002290, 10 pages, mailed Oct. 15, 2013.
Chinese Office action for Application No. 201380042368.8, dated Feb. 15, 2016, and English translation, 15 pages.
Notification of Reasons for Rejection issued in corresponding Japanese Patent Application No. 2015-525769, dated Mar. 8, 2016, 5 pages.
English translation of Notification of Reasons for Rejection, 5 pages.

* cited by examiner

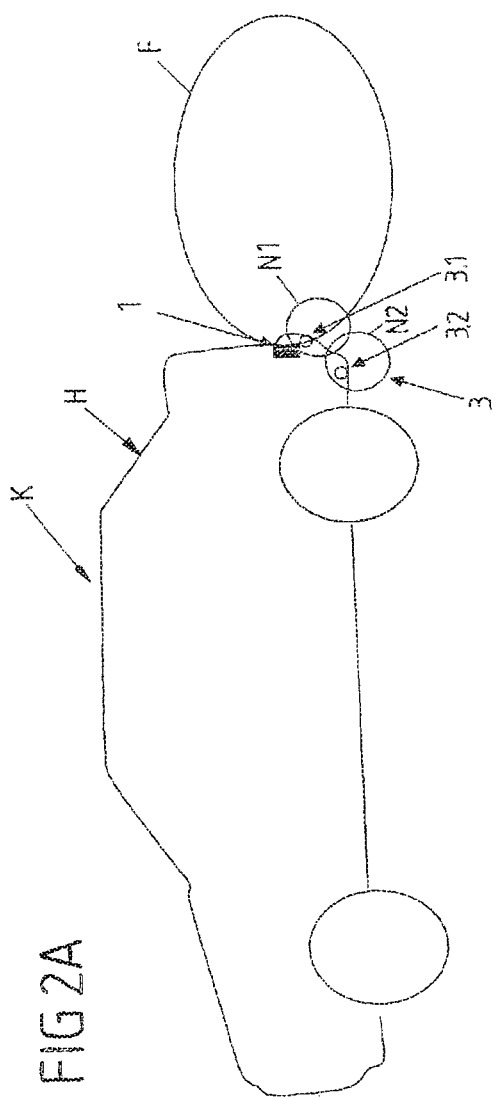
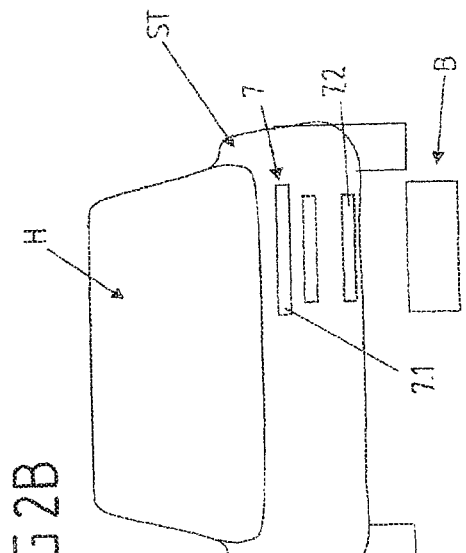
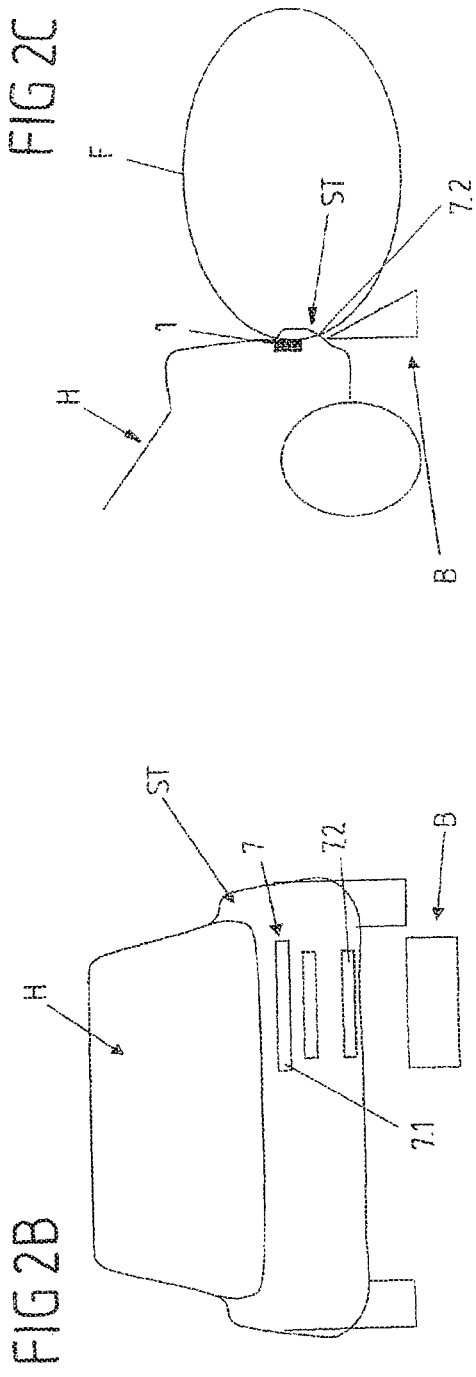

CONTROL METHOD AND CONTROL SYSTEM FOR A VEHICLE CLOSING ELEMENT

CROSS-REFERENCE TO A RELATED APPLICATION

This application is a National Phase patent application of International Patent Application Number PCT/EP2013/002290, filed on Aug. 1, 2013, which claims priority of German Patent Application Number 10 2012 107 288.4, filed on Aug. 8, 2012.

BACKGROUND

The present invention relates to a method for controlling an adjusting movement of a power-operated adjustable vehicle closing element, such as a vehicle side door or a vehicle liftgate, and to a control system.

For triggering an adjusting movement of a power-operated, in particular motor-driven adjustable vehicle closing element, it is known to detect operating events in a contactless manner by means of at least one sensor element provided at the vehicle, which originate from a movement of an (authorized) user. For this purpose, a sensor element comprises for example a proximity sensor by which an approach of a person or a user to the vehicle can be detected and this can possibly be assessed as operating event, in order to initiate a motor-driven adjustment of the vehicle closing element.

From DE 10 2005 032 402 B3 it is known for example to detect an approach of a person to a vehicle by monitoring two spatially separate zones, which are located at different distances from the vehicle, as to whether a person is moving from a position in the one more remote zone in a predetermined direction into the other, nearer zone. When such an approach is detected with reference to the two monitored zones, an authentification process subsequently is initiated automatically, in order to additionally detect whether a valid identification means, e.g. a radio key of a keyless entry system, is carried by the approaching person.

In the method known from DE 10 2005 032 402 B3 it can occur, however, that each approach of a person carrying the identification means to the vehicle leads to an automatic adjustment of the vehicle closing means, i.e. for example to the automatic opening of a liftgate. Possible false activations might be compensated by a more complex evaluation logic, such as by taking account of the speed of the approaching person and a possible dwell time in one of the two zones. However, this is comparatively complex and regularly involves higher costs.

SUMMARY

Proceeding from the above-mentioned prior art it therefore is an object underlying the present invention to further improve a control method for the adjustment of a vehicle closing element, in order to at least minimize the disadvantages mentioned and to more effectively avoid possible false activations. In addition, it is an object of the present invention to provide an associated control system for carrying out such method.

This object is solved both with the method as described herein and with the control system as described herein.

In the inventive method for controlling an adjusting movement of a power-operated adjustable vehicle closing element, such as a side door or a liftgate, by which a body opening of a vehicle can be closed and which can automatically be adjusted for clearing the body opening in the presence of an operating event, it is provided:

- to monitor at least one distant region in the surroundings of the vehicle by means of at least one first sensor element of the vehicle, wherein via the at least one first sensor element a person in the distant region is detectable in a contactless manner;
- to carry out an authentification process in which the presence of a valid identification means in a defined surrounding region (possibly different from the distant region) in the surroundings of the vehicle is checked, when a person has been detected in the distant region via the at least one first sensor element;
- to monitor a nearby region in the surroundings of the vehicle by means of at least one second sensor element of the vehicle, which is different from the first sensor element, wherein
  - a an outermost edge of the nearby region is located closer to the vehicle than an outermost edge of the distant region, and
  - via the at least one second sensor element the occurrence of an operating event is detectable in a contactless manner, in which a person performs a particular movement in the monitored nearby region with a body part, and
- to adjust the vehicle closing element when one after the other a person is detected in the distant region, a valid identification means is detected in the surrounding region, and an operating event has been detected in the at least one nearby region.

In the method according to the invention, at least three conditions thus must be satisfied successively, so that an automatic adjustment of the vehicle closing element actually is effected. In particular two conditions in regions different from each other, a distant region on the one hand and a nearby region on the other hand, must be satisfied, which are characterized by a different reach of the two first and second sensor elements.

While the at least one first sensor element thus detects an approach of a person in a distant region located further away from the vehicle (its outermost edge is located further away, the distant region thus reaches further), the monitoring of the at least one second sensor element is limited to a nearby region located closer to the vehicle, which possibly also is many times smaller than the monitored distant region. Only when a person in the at least one monitored nearby region performs a particular movement, which by means of the at least one second sensor element is assessed as the operating event ultimately triggering the adjustment, the power-operated adjustment of the vehicle closing element is effected. Possible false activations thus can be excluded much more reliably in a simple way, as several conditions must be satisfied, at least one of which—despite a continuously contactless control—must deliberately be satisfied by a user.

Usually, the surrounding region in which the presence of a valid identification means, such as a radio key with built-in transponder, is checked, will be different from the distant region and the at least one monitored nearby region. In particular, this depends on the type of sensor system used, i.e. for example on the used transmitters and receivers. In connection with a development of the method according to the invention it is preferred when the reach for detecting a valid identification means does not go beyond the reach of the distant region, i.e. the maximum admissible distance to the vehicle or more exactly the vehicle closing element to be adjusted, in which a detection of a valid identification means still is possible, is not greater than the distance at which the detection of a person still is possible via the at least one first sensor element. On the basis of the present invention it thus is fully sufficient to limit the reach of a receiver for detecting a valid identification means, when it is anyway ensured by the at least one first sensor element that an authentification process only is started when a person already is present within the monitored distant region. In this way not only costs can be saved, but the energy consumption of a corresponding control system also can be lowered.

In connection with a further saving of energy it is also provided in one design variant that the at least one second sensor element for monitoring the nearby region only is activated when a person has been detected in the distant region via the at least one first sensor element. In the method according to the invention it already is provided for the improved adjustability to the different regions that the at least one first sensor element for monitoring the distant region and the at least one second sensor element for monitoring the nearby region are different from each other. With the activation of the second sensor element (or further sensor elements) for monitoring the nearby region (or several nearby regions) only after detecting a person in the distant region further advantages can yet be achieved. For example, the at least one second sensor element only is activated when it also is ensured that a person actually is present in the distant region and monitoring by the second sensor element is required at all. Otherwise, the at least one second sensor element remains deactivated, whereby the energy consumption is reduced for the entire system, as the at least one nearby region or also the several nearby regions are monitored only if necessary, but not continuously.

Alternatively or in addition it can be provided that the at least one second sensor element (or several of such sensor elements) only is (are) activated for monitoring the nearby region (or several nearby regions) when a valid identification means has been detected in the surrounding region. When the detection of a valid identification means as well as the detection of a person in the monitored distant region precedes the activation of the at least one second sensor element, possible unnecessary activations of the at least one second sensor element are minimized further.

In one design variant it is provided that at least two spatially separate nearby regions are monitored, in order to detect a movement to be assessed as operating event. With its outermost edge, each of these nearby regions is located closer to the vehicle than an outermost edge of the distant region and thus is equipped and provided to detect movements of a user in direct vicinity of the vehicle, preferably even only in direct vicinity of the vehicle closing element to be adjusted.

By monitoring two spatially separate nearby regions, the specification of more complex movements is possible, which are assessed as operating event and ultimately lead to the adjustment of the vehicle closing element. An example of such a more complex movement is the execution of a back-and-forth movement of a foot in the region of a bumper at the rear of a motor vehicle in the manner of a "kick". Experience has shown that such movement only can reliably be detected by the contactless monitoring of two spatially separate nearby regions. One nearby region for example covers a region directly in front of the bumper and the second nearby region covers a region below the bumper in direction of the road surface. Only when by monitoring both nearby regions characteristic measurement signals are generated, which on the one hand suggest the presence of a lower leg in front of the bumper and on the other hand the introduction of a foot in the region between bumper and road surface and the subsequent retraction of this foot (i.e. the execution of a "kick" movement), will this be assessed as the occurrence of an operating event which—in case the at least two other conditions have been satisfied previously—leads to the adjustment of the vehicle closing element. Here, it each is decisive that a user need not manually actuate the vehicle closing element, but the adjustment is triggered electronically by a contactless detection.

For this purpose, the individual sensor elements for example can comprise capacitive or optical sensors and/or ultrasound or microwave sensors.

For monitoring the at least two spatially separate nearby regions it can be provided that the at least one further nearby region is monitored by another sensor element. This other sensor element can be at least one further, third sensor element, which is different both from the at least one first sensor element and from the at least one second sensor element.

Alternatively, the at least one further nearby region can be monitored by the first sensor element which also monitors the distant region. Such first sensor element thus can integrate for example sensors of different reach, which are designed and provided on the one hand for monitoring the distant region and on the other hand for monitoring a second nearby region. In another design variant the first sensor element can be switchable, so that after detecting a person in the distant region and successfully detecting a valid identification means it is switched into another mode, in which the first sensor element no longer monitors the distant region, but exclusively the at least one further nearby region, in order to be able to detect the occurrence of an operating event.

For accommodating the individual sensor elements in a manner saving installation space, the same are electronically coupled with each other as part of a common sensor device (possibly via an electronic control unit and/or a common power supply).

Moreover, it was found to be advantageous to provide the different sensor elements on a common printed circuit board. For example, a second sensor element with a capacitive sensor for monitoring a nearby region can be arranged on the same printed circuit board as a sensor element for monitoring a distant region, which comprises a microwave sensor and an associated receiver. When monitoring a rear region of a motor vehicle for the automatic adjustment of a motor vehicle liftgate, the individual sensor elements preferably are accommodated in the region of the rear of the motor vehicle, particularly preferably in the region of the bumper.

In one design variant it can be detected by means of the at least one sensor element for monitoring the distant region or be detectable by this sensor element, whether a person present within the distant region approaches the vehicle. Here, it not only is detected whether a person is present in the distant region or enters into the same, but also whether an approach of this person to the vehicle, preferably to the vehicle closing element to be adjusted, takes place. Such approach for example can be effected by repeated (cyclic) measurements of a distance by means of this at least one first sensor element, possibly by utilizing the Doppler effect. Another possibility constitutes the monitoring of different zones within the distant region, which is known from DE 10 2005 032 402 B3 and has briefly been explained above.

To signal the current status or the activation of individual components of the control system to a person approaching the vehicle, it is provided in a development of the method according to the invention that after detecting a person in the distant region or after the subsequent detection of a valid identification means in the surrounding region a visually and/or acoustically perceptible message is issued at the vehicle by means of a signaling device. The person approaching the vehicle or the authorized user approaching the vehicle thereby is given a feedback as to whether the control system has been activated and in particular whether it is prepared to initiate an adjustment of the vehicle closing element, when finally the movement pattern stored as operating event also is executed in direct vicinity of the vehicle. Via the visually and/or acoustically perceptible message it thus is signaled to the user whether the conditions required for the adjustment are regarded as satisfied by the control system.

Such signaling device preferably comprises an illuminated signaling element and/or a signaling element provided for illumination at the vehicle. An illuminated signaling element for example can be a separate signal lamp, the interior lighting, a tail lamp or a flasher. A signaling element provided for illumination for example is a spotlight or a headlamp, by means of which preferably at least the monitored nearby region or at least one of the monitored nearby regions is illuminated or even lighted. The activation of a signaling element provided for illumination thus involves a visible indication as to where monitoring takes place and a movement to be assessed as operating event must be executed, so that the same can be detected by the control system. Via such signaling device a user thus knows in what region at or around the vehicle an operating event for adjusting the vehicle closing element can be triggered at all.

Alternatively or in addition it can also be provided to issue a sound or an audible message, in order to inform e.g. on the detection of a valid identification means or a valid operating event.

For the information on the detection of a valid operating event it can also be provided in one design variant that a signaling element (illuminated or provided for illumination) varies its brightness and/or light color when an operating event has been detected. It can be provided, for example, that the respective signaling element flashes, in order to indicate the successful detection of an operating event. It is of course also possible, however, that a flashing signaling element is used for issuing a visually perceptible message before detecting an operating event, in order to signal the preceding activation of the monitoring of the nearby region or the nearby regions.

As already explained above, the vehicle closing element preferably is a side door or a liftgate of a motor vehicle.

Furthermore, an identification means whose presence is checked in connection with the authentification process, preferably is a radio key of the vehicle, preferably a radio key of a keyless entry system. Such radio key for example can comprise an integrated transponder, in order to be able to perform an authentification process between vehicle and radio key by means of corresponding encoding and decoding. Such systems are widely known, so that a further explanation thereof will be omitted in the present application.

A further aspect of the present invention is the provision of a control system for a motor-driven adjusting device for adjusting a vehicle closing element, in particular for carrying out a method according to the invention.

In this control system in particular an electronic control device is provided, which additionally is equipped and provided for carrying out an authentification process, for automatically initiating an adjustment of the vehicle closing element when one after the other via at least one first sensor element of the control system a person is detected in a distant range, a valid identification means is detected in a surrounding region, and an operating event has been detected in at least one nearby region, which is monitored by another, second sensor element.

Part of such control system in particular can be capacitive and/or optical proximity sensors as well as a signaling device as described above.

Since a control system according to the invention also is suitable for carrying out a method according to the invention, the features and advantages described in connection with the method also apply for a control system according to the invention and its possible design variants, and vice versa.

In addition, it should be noted that a power-operated adjustment of a vehicle closing element in particular is understood to be any motor-driven adjustment, i.e. in particular the adjustment by means of an electric motor, hydraulic motor and/or pneumatic motor.

BRIEF DESCRIPTION OF THE DRAWINGS

Further advantages and features of the present invention will become apparent from the following description of exemplary embodiments with reference to the Figures.

FIG. 2A schematically shows the arrangement and the monitored regions of an exemplary embodiment of a control system according to the invention for the automatic adjustment of a liftgate.

FIGS. 2B-2C schematically show a development of the control system of FIG. 2A with a signaling device for generating visually perceptible indications for a user, by which a user is informed about the activation and the function of the control system.

DETAILED DESCRIPTION

Figure 1A:
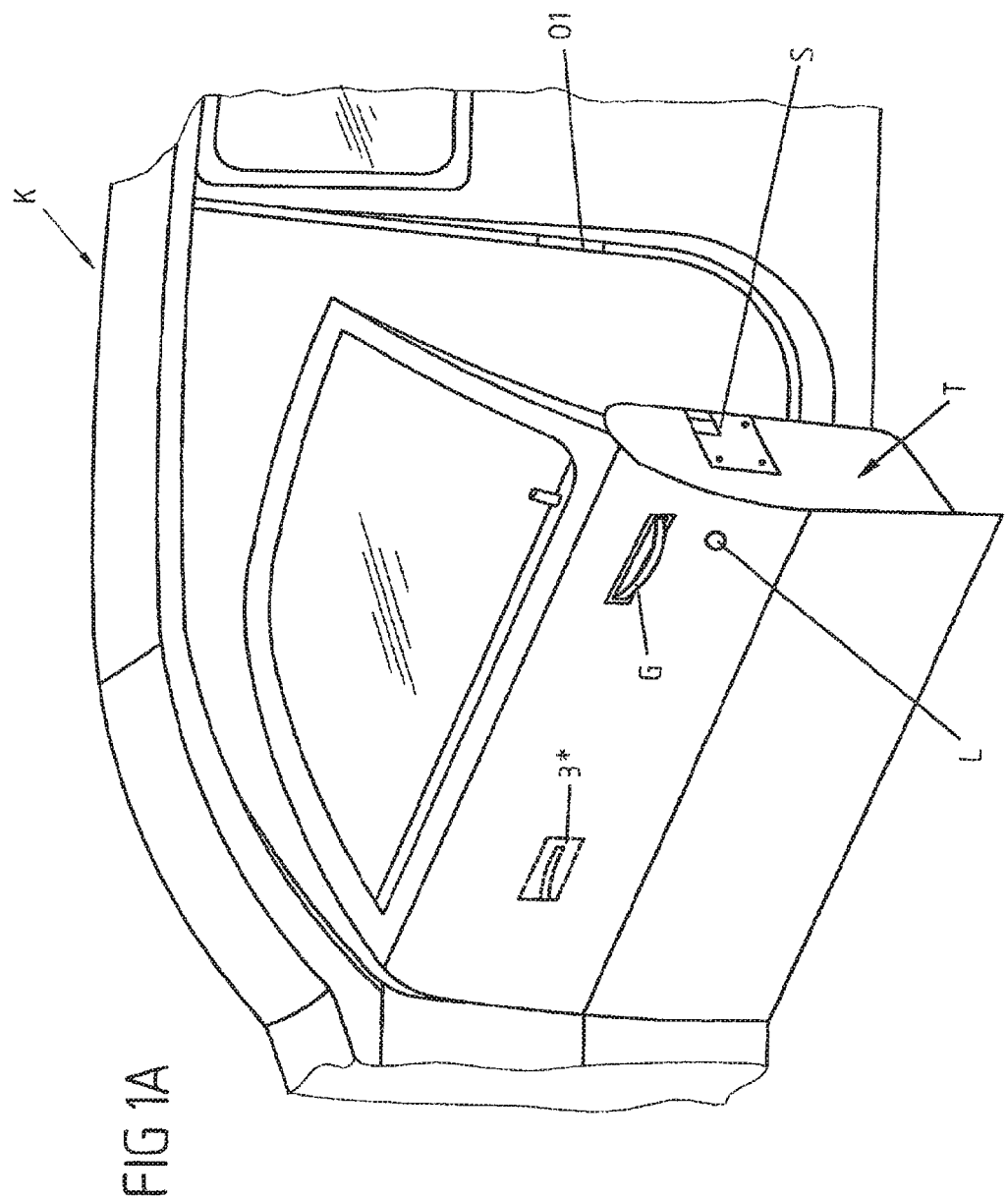
FIG. 1A shows a section of a motor vehicle with a vehicle closing element in the form of a side door which according to one design variant of the present invention is automatically adjustable.
Figure 1B:
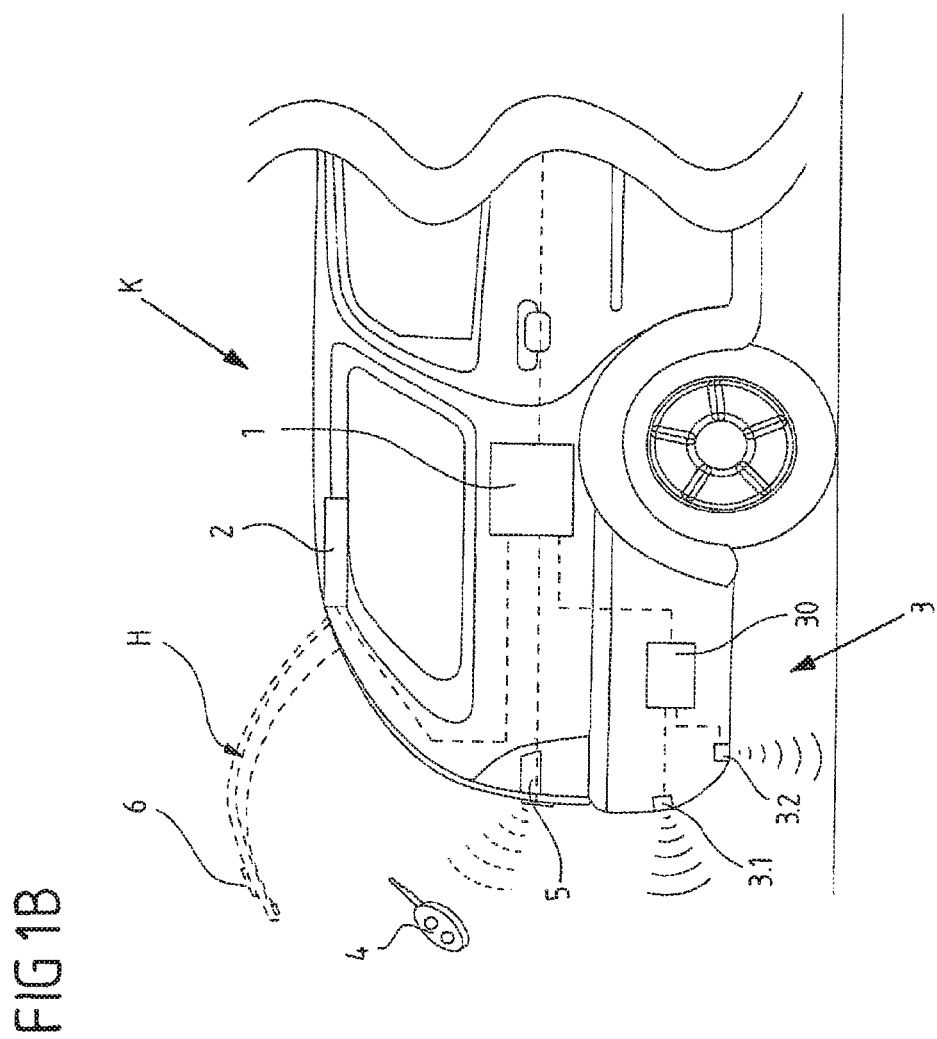
FIG. 1B shows a section of a motor vehicle with a vehicle closing element in the form of a liftgate which according to one design variant of the present invention is automatically adjustable.

FIGS. 1A and 1B each show a section of a motor vehicle K in which a body opening O1 and O2 each can be closed by a vehicle closing element in the form of a side door T or in the form of a liftgate H. The side door T and the liftgate H here are adjustable automatically via a design variant of a control system according to the invention for clearing the respective body opening O1, O2 in the presence of an operating event detected in a contactless manner. By means of a motorized drive unit, the illustrated vehicle closing elements T and H can automatically be transferred into a collapsed or pivoted position in which they clear the respective body opening O1, O2. In one design variant, the side door T and/or the liftgate H also can again be closed automatically by means of a motorized drive unit.

The side door T shown in FIG. 1A provides for unlocking a lock S via a key hole L and a door handle G in a closed condition of the side door T and for manual opening by a user. In addition, via a non-illustrated motorized drive unit an automatic opening (and closing) of the side door T is possible.

Via a sensor device 3\* in particular the occurrence of an operating event due to the execution of a particular movement with a body part in the surroundings of the side door T is detected in a contactless manner. The sensor device 3\* is integrated into the side door T and by means of two different, non-illustrated first and second sensor elements, for example with optical and/or capacitive proximity sensors, monitors both a distant region and a nearby region in the surroundings of the motor vehicle K and preferably exclusively in the surroundings of the side door T. Via the sensor device 3\* and the sensor elements provided therein, it is possible on the one hand to detect a person in a distant region, i.e. at a larger distance to the motor vehicle K. When a person is detected in this distant region and possibly even an approach to the side door T is detected, an authentification process is started via an electronic control device (not shown in FIG. 1A) coupled with the sensor device 3\* or via a control device integrating the sensor device 3\*, in which the presence of a valid identification means in a surrounding region around the motor vehicle K is checked.

When the result of this check is positive, i.e. when the presence of a valid identification means is detected for example with reference to the exchange of coded signals, second sensor elements provided for monitoring a nearby region in the direct vicinity of the side door T are activated. Via these second sensor elements, a particular movement of a user with his hand, his arm or his foot for example is detectable with reference to related characteristic measurement signals which are stored in the electronic control device as operating event and ultimately trigger the adjustment of the side door T—preferably its opening. An outermost edge of a monitored nearby region for example is located at distance of less than 1 meter from the side door, so that the occurrence of an operating event only can be detected in a radius of less than 1 meter. It can be provided, for example, that via at least one non-illustrated second sensor element of the sensor device 3\* in the lower part of the door frame or the underside of the body facing the road surface a back-and-forth movement of a hand or a foot of the user in the manner of a "kick" is detected and assessed as operating event.

Further details and features of the control system of FIG. 1A and of the control method realized therewith will become even clearer in connection with the following description of a design variant in which an automatic adjustment of a liftgate H of a motor vehicle K as vehicle closing element is effected. The liftgate H of the motor vehicle K as shown in FIG. 1B (and also in FIGS. 2A-2C) is to be adjusted automatically in a way analogous to the side door T of FIG. 1A.

The sensor device 3 of the control system provided for adjusting the liftgate H is arranged in the region of a bumper ST at the rear of the motor vehicle K and coupled with an electronic control device 1 of the control system. The sensor device 3 receives the signals generated by the sensor elements 3.1, 3.2 and evaluates the same as to whether a person has been detected in a distant region monitored by the first sensor element 3.1 and whether an operating event has occurred in a nearby region monitored by a second sensor element 3.2 different from the first sensor element, after meanwhile a valid identification means in the form of a radio key 4 also has been detected in the surroundings of the motor vehicle K. Only when successively checked conditions are present and ultimately a valid operating event has been detected, is the adjustment of the liftgate H effected by means of the control device 1.

By means of its at least two sensor elements 3.1 and 3.2 spatially spaced from each other, the sensor device 3 also is able to check necessary conditions in a contactless manner before adjusting the liftgate H, so that possible false activations are avoided effectively. In the present exemplary embodiment, the measurement signals detected by the two sensor elements 3.1, 3.2 are forwarded to an evaluation unit 30 of the sensor device 3, which then sends the same to the control device 1. In an alternative design variant it can of course be provided that the evaluation unit 30 is omitted and signals of the sensor elements 3.1, 3.2 are directly transmitted to the control device 1.

In the present case, the control device 1 also is coupled with a key detector 5 or in an alternative design variant equipped with the same, in order to carry out an authentification process in which it is checked whether in a defined surrounding region around the motor vehicle K a valid identification means in the form of a radio key 4 is present. Consequently, an authentification process is carried out, in order to find out whether an authorized user actually is present in the surroundings of the motor vehicle K, before the liftgate H is opened. Such radio key 4 preferably is part of a so-called keyless entry system and for example can comprise a transponder.

The adjustment of the liftgate H in response to an adjustment signal of the control device 1 here is carried out by a motorized drive unit 2, by means of which the liftgate H can be opened and preferably also can be closed.

Preferably, the sensor device 3 which evaluates the signals of the sensor elements 3.1, 3.2 and the control device 1 which evaluates the signals of the key detector 5 are integrated in a single control unit.

The mode of operation of the control system shown in FIG. 1B is illustrated in more detail in particular in FIG. 2A. In FIG. 2A, the distant region F monitored by the first sensor element 3.1 of the sensor device 3 as well as a nearby region N2 can be seen, which is monitored by the second sensor element 3.2. The distant region F monitored at the rear of the motor vehicle K here is many times greater than the nearby region N2 and the outermost edge of the distant region F also is distinctly further away than an outermost edge of the nearby region N2. In other words, this means that via the first sensor element 3.1 a person or possibly its movement is detectable at a much greater distance to the rear of the motor vehicle K than via the second sensor element 3.2

In one variant, when the motor vehicle K is parked, exclusively the first sensor element 3.1 is activated for monitoring the distant region F. When a person now is detected in the distant region F via the sensor element 3.1 (and the associated evaluation via the electronic control device 1), an authentification process is started. It thereby is avoided that a possible adjustment of the liftgate H is effected without an authorized user of the motor vehicle K being present in the vicinity of the motor vehicle K, and thus a wrongful adjustment of the liftgate H possibly will be effected. Via the key detector 5, the presence of the radio key 4 in the surroundings of the motor vehicle K hence is checked.

Only when it has been detected in the authentification process that a valid radio key 4 is present, will the hitherto inactive second sensor element 3.2 be activated. In the present case, the first sensor element 3.1 also can additionally be switched into an operating mode in which it monitors a further, second nearby region N1 behind the bumper ST, alternatively or in addition to monitoring the distant region F. By monitoring the two nearby regions N1, N2 spatially spaced from each other a characteristic foot movement of an (authorized) user can be detected in front of the bumper ST on the one hand and below the bumper ST on the other hand, which is assessed as occurrence of an operating event and ultimately leads to the opening of the liftgate H without the user having to touch the motor vehicle K or the liftgate H. A characteristic movement of a foot assessed as operating event for example would be a back-and-forth movement in the manner of a "kick" in which characteristic measurement signals are delivered by the two sensor elements 3.1, 3.2.

By checking the presence of individual conditions one after the other according to the invention, before an adjustment of the liftgate H (or the side door T) is effected, possible false activations or wrongful actuations can reliably be excluded. In that in addition the second sensor element 3.2 only is activated when a person previously has been detected in the monitored distant region F and even only when also a valid radio key 4 has additionally been detected, the energy consumption of a control system according to the invention can be lowered decisively.

To in addition visually and/or acoustically inform a user about the status of the sensor device 3 or 3* and/or about a monitored region in which an operating event must be detected, it is provided in one possible development to form a signaling device 7 on the motor vehicle K as part of the control system. Such signaling device 7 then is provided with signaling elements e.g. in the form of illuminating means, such as light-emitting diodes, in order to inform a user about the respective status of the sensor device 3, 3*. Alternatively or in addition, such signaling device 7 of course can also be capable of issuing an acoustic message.

In FIGS. 2B and 2C a signaling device 7 is shown by way of example. This signaling device 7 here includes a plurality of signaling elements 7.1, 7.2 in the form of light strips (signaling element 7.1) and directional lamps (signaling element 7.2). The signaling element 7.1 thus is an illuminated signaling element, whereas the signaling element 7.2 is formed and provided for illuminating or lighting a particular region in the surroundings of the motor vehicle.

Via a signaling element 7.1 for example in the region of the bumper ST a user can be informed via different colors or different numbers of illuminated segments and/or changing light colors as to whether the sensor device 3 of the control system is activated, or which of the sensor elements 3.1, 3.2 is activated. In particular, there can be issued a visually perceptible message as to whether a person has successfully been detected in the distant region F and/or whether a valid radio key 5 has been detected in the surrounding region.

Furthermore—after activation of the sensor elements 3.1, 3.2 for monitoring the respective nearby regions N1, N2—a signaling region B can be lighted via the signaling element 7.2 Via this lighted signaling region B, a user is informed about the point at which he must execute a particular movement with his foot in the region of the bumper ST, so that said movement can be assessed as operating event for opening the liftgate H. The signaling region B preferably is almost congruent with the monitored nearby region N2.

Alternatively or in addition, a tail lamp 6 or a flasher at the rear of the motor vehicle K can be part of such signaling device 7, in order to visually inform a user about the status and/or function of the sensor device 3 or the sensor elements 3.1, 3.2. The interior lighting also can be part of such signaling device 7, in that the same is activated for example when the occurrence of an operating event in the region of the bumper ST has successfully been detected.

Figure 3:
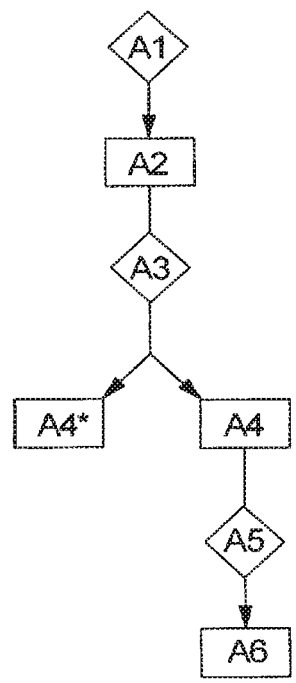
FIG. 3 shows a flow diagram of a design variant for a method according to the invention.

FIG. 3 by way of example illustrates a possible design variant of a method according to the invention with reference to a flow diagram. There are shown individual method steps A1 to A6.

The method starts with a method step A1 in which via the first sensor element 3.1 a person is detected in the monitored distant region F, for example by approach of a person to the motor vehicle K. In a succeeding method step A2 the presence of a valid identification means, such as the radio key 4, in the surroundings of the motor vehicle K now is checked, in order to find out whether an authorized user, who carries the radio key 4, is present in the vicinity of the motor vehicle K. When in a method step A3 a valid identification means then is detected by means of the electronic control device 1, a succeeding method step A4 then includes the activation of the hitherto inactive second sensor element 3.2 for monitoring the nearby region N2 below the bumper ST. At the same time, either the first sensor element 3.1 also is activated or switched for monitoring the further nearby region N1 in front of the bumper ST. Alternatively a further, third sensor element also can be provided for exclusively monitoring the further nearby region N1 and be activated in method step A4.

Moreover, it should be mentioned that it is of course also possible that the nearby regions N1, N2 monitored by the individual sensor elements 3.1, 3.2 or by a third non-illustrated sensor element in the region of the bumper ST also can differ from the nearby regions N1, N2 shown by way of example in FIG. 2A and for example can be interchanged.

When a valid operating event, e.g. a "kick", is detected in a contactless manner in the region of the bumper ST via the sensor elements 3.1, 3.2 now active for monitoring the nearby region and is assessed as such by the electronic control device 1 (method step A5), the adjustment—here the opening—of the liftgate H is initiated by the electronic control device 1 in a succeeding method step A6.

Together with the activation of the sensor system for monitoring the one or more nearby regions N1, N2, the additional activation of the signaling device 7 can be effected, as is illustrated with method step A4* in the flow diagram of FIG. 3.

Figure 4A:
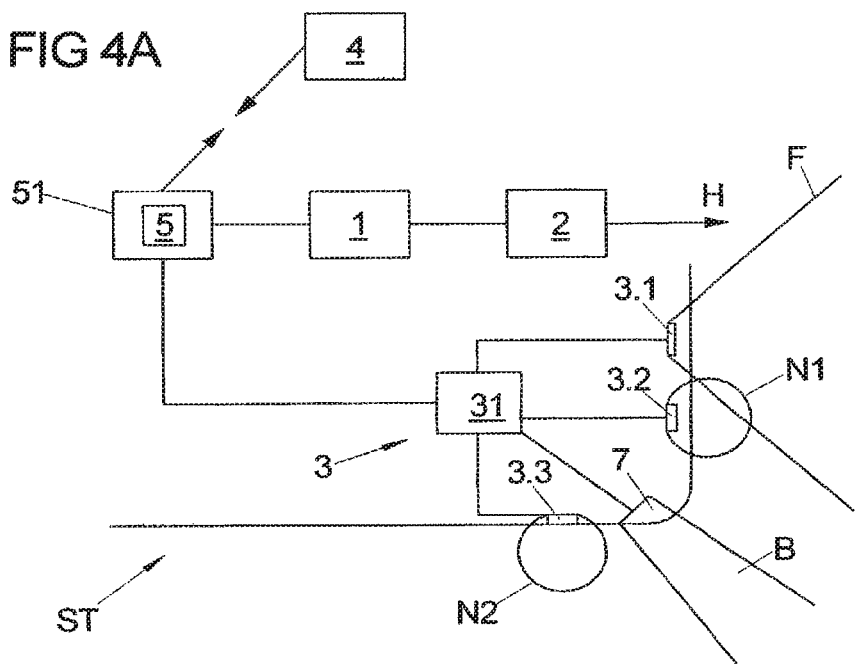
FIGS. 4A-4C show three further variants of a control system according to the invention.
Figure 4B:
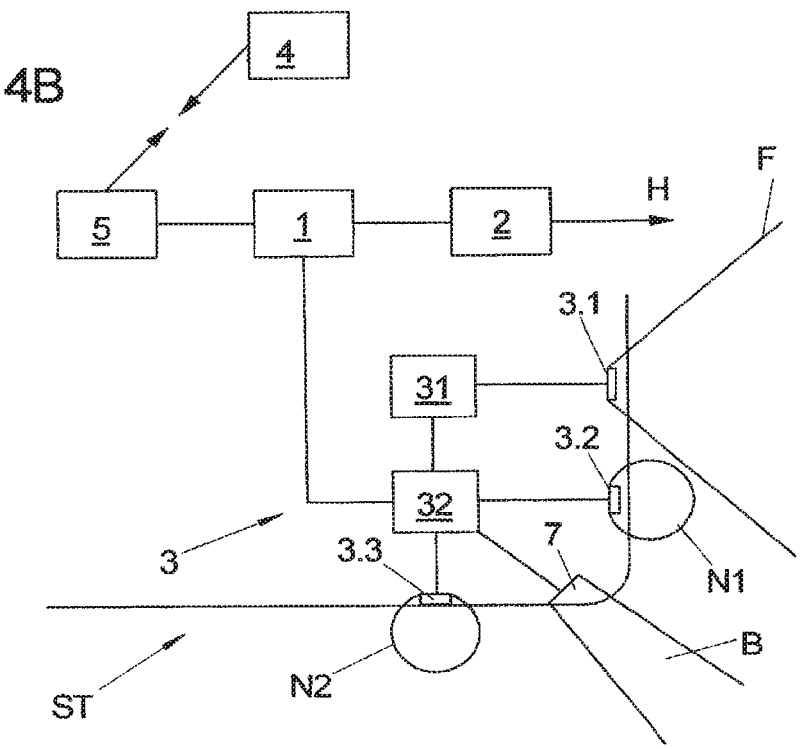
Figure 4C:
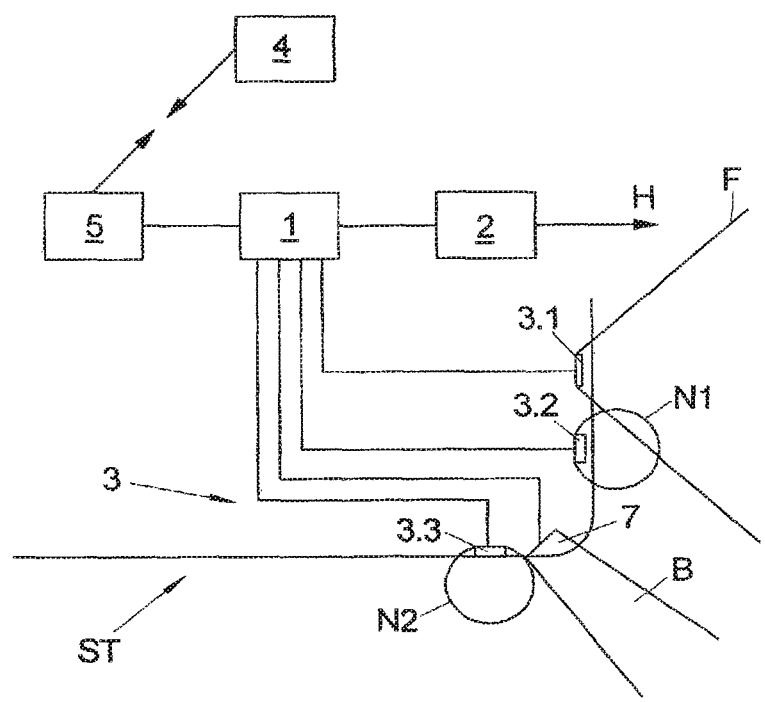

FIGS. 4A, 4B and 4C by way of example illustrate three further variants of a control system according to the invention.

In the variant of FIG. 4A the sensor device 3 in the region of the bumper ST at the rear of the motor vehicle K is designed with a first control unit 31, which controls first, second and third sensor elements 3.1, 3.2 and 3.3 for monitoring the distant region F and the two nearby regions N1 and N2 and evaluates their signals. Monitoring of the distant region F in this variant is performed by the first sensor element 3.1, whereas for monitoring the two nearby regions N1, N2 one additional sensor element 3.2, 3.3 each is provided. In addition, the signaling device 7 is controlled by the first control unit 31 or the sensor device 3.

The sensor device 3 is coupled with a second control unit 51, preferably of a keyless entry system, which comprises the key detector 5.

The second control unit 51 in turn is coupled with the control device 1 as a third control unit, which controls the drive 2 for opening and closing the liftgate H.

In the variant of FIG. 4B the sensor device 3 comprises two control units 31 and 32. A first control unit 31 controls and evaluates signals from and to the first sensor element 3.1 for monitoring the distant region F. A second control unit 32 controls and evaluates signals from and to the second and third sensor elements 3.2, 3.3 as well as the signaling device 7.

In variant 4C merely one single (liftgate) control unit in the form of the control device 1 is accommodated at the rear of the motor vehicle K, via which both the first sensor element 3.1 for monitoring the distant region F and the second and third sensor elements 3.2, 3.3 for monitoring the nearby regions N1, N2 are controlled and their signals are evaluated. In addition, the control device 1 here also controls the signaling device 7 and the drive 2.

The invention claimed is:
1. A method for controlling an adjusting movement of a power-operated adjustable vehicle closing element, via which a body opening of a vehicle can be closed and which can automatically be adjusted for clearing the body opening in the presence of an operating event, the method including the following steps:
    monitoring at least one distant region in the surroundings of the vehicle by means of at least one first sensor element of the vehicle, wherein via the at least one first sensor element a person in the distant region is detectable in a contactless manner,
    carrying out an authentification process in which the presence of a valid identification means in a defined surrounding region in the surroundings of the vehicle is checked when via the at least one first sensor element a person has been detected in the distant region,
    monitoring at least one nearby region in the surroundings of the vehicle by means of at least one second sensor element of the vehicle, which is different from the first sensor element, wherein
        an outermost edge of the nearby region is located closer to the vehicle than an outermost edge of the distant region,
        via the at least one second sensor element the occurrence of an operating event is detectable in a contactless manner, in which a person performs a particular movement in the monitored nearby region with a body part, and
        the at least one second sensor element for monitoring the nearby region only is activated when via the at least one first sensor element a person has been detected in the distant region,
    and
    adjusting the vehicle closing element when one after the other a person is detected in the distant region, a valid identification means is detected in the surrounding region, and an operating event has been detected in the at least one nearby region.

2. The method according to claim 1, wherein the at least one second sensor element for monitoring the nearby region only is activated when in addition a valid identification means has been detected in the surrounding region.

3. The method according to claim 1, wherein at least two spatially separate nearby regions are monitored, in order to detect a movement to be assessed as operating event.

4. The method according to claim 3, wherein the at least one further nearby region is monitored by another sensor element.

5. The method according to claim 4, wherein the at least one further nearby region is monitored by at least one further, third sensor element in a contactless manner.

6. The method according to claim 4, wherein the at least one further nearby region is monitored by the first sensor element which also monitors the distant region.

7. The method according to claim 1, wherein when monitoring the distant region it can be detected whether a person enters into the distant region.

8. The method according to claim 1, wherein by means of the at least one first sensor element it is detected whether a person present within the distant region approaches the vehicle.

9. The method according to claim 1, wherein after detecting a person in the distant region or after detecting a valid identification means in the surrounding region, a visually and/or acoustically perceptible message is issued at the vehicle by means of a signaling device.

10. The method according to claim 9, wherein the message is issued by an illuminated signaling element at the vehicle and/or a signaling element provided for illumination at the vehicle.

11. The method according to claim 10, wherein a signaling element provided at the vehicle for illumination illuminates at least one monitored nearby region.

12. The method according to claim 10, wherein a signaling element changes its brightness and/or light color when an operating event has been detected.

13. The method according to claim 10, wherein a signaling element flashes, in order to issue a visually perceptible message and/or indicate the successful detection of an operating event.

14. The method according to claim 1, wherein the vehicle closing element is a side door or a liftgate and/or the identification means is a radio key of the vehicle.

15. A control system for a motorized adjusting device for adjusting a vehicle closing element, via which a body opening of a vehicle can be closed and which can automatically be adjusted for clearing the body opening in the presence of an operating event, in particular for carrying out the method according to claim 1, comprising:
    at least one first sensor element which is equipped and provided at the vehicle for monitoring at least one distant region in the surroundings of the vehicle in a contactless manner, so that via the at least one first sensor element a person in the distant region is detectable in a contactless manner,
    at least one electronic control device which is equipped and provided to carry out an authentification process in which the presence of a valid identification means in a defined surrounding region in the surroundings of the vehicle is checked when via the at least one first sensor element a person has been detected in the distant region, and
    at least one second sensor element which is different from the first sensor element and which is equipped and provided at the vehicle,
        to monitor at least one nearby region in the surroundings of the vehicle in a contactless manner, which includes an outermost edge which is located closer to the vehicle than an outermost edge of the distant region,
        to detect the occurrence of an operating event in a contactless manner, in which a person performs a particular movement in the monitored nearby region with a body part, and
        to activate the at least one second sensor element for monitoring the nearby region only when via the at least one first sensor element a person has been detected in the distant region,
    wherein the electronic control device furthermore is equipped and provided to automatically initiate an adjustment of the vehicle closing element when one after the other a person is detected in the distant region, a valid identification means is detected in the surrounding region, and an operating event has been detected in the at least one nearby region.

16. A method for controlling an adjusting movement of a power-operated adjustable vehicle closing element, via which a body opening of a vehicle can be closed and which can automatically be adjusted for clearing the body opening in the presence of an operating event, the method including the following steps:

monitoring at least one distant region in the surroundings of the vehicle by means of at least one first sensor element of the vehicle, wherein via the at least one first sensor element a person in the distant region is detectable in a contactless manner, carrying out an authentification process in which the presence of a valid identification means in a defined surrounding region in the surroundings of the vehicle is checked when via the at least one first sensor element a person has been detected in the distant region, monitoring at least one first nearby region in the surroundings of the vehicle by means of at least one second sensor element of the vehicle, which is different from the first sensor element, wherein an outermost edge of the first nearby region is located closer to the vehicle than an outermost edge of the distant region, and via the at least one second sensor element the occurrence of an operating event is detectable in a contactless manner, in which a person performs a particular movement in the monitored first nearby region with a body part, monitoring at least one second nearby region spatially separate from the first nearby region, in order to detect a movement to be assessed as operating event, wherein the at least one second nearby region is monitored by the first sensor element which also monitors the distant region, and adjusting the vehicle closing element when one after the other a person is detected in the distant region, a valid identification means is detected in the surrounding region, and an operating event has been detected in the first and second nearby regions.

17. A control system for a motorized adjusting device for adjusting a vehicle closing element, via which a body opening of a vehicle can be closed and which can automatically be adjusted for clearing the body opening in the presence of an operating event, comprising:

at least one first sensor element which is equipped and provided at the vehicle for monitoring at least one distant region in the surroundings of the vehicle in a contactless manner, so that via the at least one first sensor element a person in the distant region is detectable in a contactless manner, at least one electronic control device which is equipped and provided to carry out an authentification process in which the presence of a valid identification means in a defined surrounding region in the surroundings of the vehicle is checked when via the at least one first sensor element a person has been detected in the distant region, and at least one second sensor element which is different from the first sensor element and which is equipped and provided at the vehicle,
  to monitor at least one nearby region in the surroundings of the vehicle in a contactless manner, which includes an outermost edge which is located closer to the vehicle than an outermost edge of the distant region, and
  to detect the occurrence of an operating event in a contactless manner, in which a person performs a particular movement in the monitored nearby region with a body part, wherein the first sensor element which monitors the distant region also is equipped and provided to monitor at least one second nearby region spatially separate from the first nearby region, in order to detect a movement to be assessed as operating event, and the electronic control device furthermore is equipped and provided to automatically initiate an adjustment of the vehicle closing element when one after the other a person is detected in the distant region, a valid identification means is detected in the surrounding region, and an operating event has been detected in the first and second nearby regions.

* * * * *